United States Patent
Arsovski et al.

(10) Patent No.: US 10,551,436 B2
(45) Date of Patent: Feb. 4, 2020

(54) CUSTOMER-TRANSPARENT LOGIC REDUNDANCY FOR IMPROVED YIELD

(71) Applicant: INTERNATIONAL BUSINESS MACHINES CORPORATION, Armonk, NY (US)

(72) Inventors: Igor Arsovski, Williston, VT (US); John R. Goss, South Burlington, VT (US); Eric D. Hunt-Schroeder, South Burlington, VT (US); Andrew K. Killorin, Weybridge, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 153 days.

(21) Appl. No.: 15/700,597

(22) Filed: Sep. 11, 2017

(65) Prior Publication Data

US 2017/0370990 A1    Dec. 28, 2017

Related U.S. Application Data

(63) Continuation of application No. 14/995,353, filed on Jan. 14, 2016, now Pat. No. 9,791,507, which is a (Continued)

(51) Int. Cl.
*G01R 31/3177*    (2006.01)
(52) U.S. Cl.
CPC ................ *G01R 31/3177* (2013.01)
(58) Field of Classification Search
CPC ........ G01R 31/3177; G01R 31/318541; G01R 31/318566; G01R 31/318583;
(Continued)

(56) References Cited

U.S. PATENT DOCUMENTS

| 4,798,976 A | 1/1989 | Curtin et al. |
| 6,237,864 B1 | 5/2001 | Firdaus |

(Continued)

FOREIGN PATENT DOCUMENTS

EP    1236207    4/2012

OTHER PUBLICATIONS

M. Lu et al., "IEEE 1149.1 based defect and fault tolerant scan chain for wafer scale integration—" 18th IEEE International Symposium on Defect and Fault Tolerance in VLSI Systems, 2003. pp. 18-25.
(Continued)

*Primary Examiner* — Nha T Nguyen
(74) *Attorney, Agent, or Firm* — Alvin Borromeo; Andrew M. Calderon; Roberts Mlotkowski Safran Cole & Calderon, P.C.

(57) ABSTRACT

Systems and methods are provided for implementing customer-transparent logic redundancy in scan chains for improved yield of integrated circuits. More specifically, an integrated circuit structure is provided for that includes a plurality of combined latch structures. Each of the combined latch structures includes an original latch and a redundant latch. The integrated circuit structure further includes a plurality of combined logic structures. Each of the combined logic structures includes an original logic structure a redundant logic structure. Each redundant latch is a duplicate of each respective original latch within a combined latch structure and each redundant logic structure is a duplicate of each respective original logic structure within a combined logic structure such that a two-fold library of latches and logic is provided for one or more scan chains of the integrated circuit structure.

16 Claims, 12 Drawing Sheets

Related U.S. Application Data continuation of application No. 14/539,527, filed on Nov. 12, 2014, now Pat. No. 9,274,171.

(58) Field of Classification Search
CPC .... G01R 31/318536; G01R 31/318544; G01R 31/318569; G01R 31/318525; G06F 11/2215; G06F 11/183; G06F 2217/14
See application file for complete search history.

(56) References Cited

U.S. PATENT DOCUMENTS

| | | |
|---|---|---|
| 6,363,020 B1 | 3/2002 | Shubat et al. |
| 6,480,019 B2 | 11/2002 | Waldie et al. |
| 6,504,411 B2 | 1/2003 | Cartagena |
| 6,930,527 B1 | 8/2005 | Cabanas-Holmen et al. |
| 7,263,642 B1 | 8/2007 | Makar et al. |
| 7,415,641 B1 | 8/2008 | Behera et al. |
| 7,437,640 B2 | 10/2008 | Rajski et al. |
| 7,661,047 B2 | 2/2010 | Rickert et al. |
| 7,836,366 B2 | 11/2010 | Sharma et al. |
| 8,689,070 B2 | 4/2014 | Huang et al. |
| 8,928,381 B1 | 1/2015 | Goh |
| 9,057,762 B1 | 6/2015 | Huang et al. |
| 9,274,171 B1 | 3/2016 | Arsovski et al. |
| 2007/0022340 A1 | 1/2007 | De Poorter et al. |
| 2007/0028157 A1 | 2/2007 | Drake et al. |
| 2007/0220381 A1 | 9/2007 | Huang et al. |
| 2007/0280012 A1 | 12/2007 | Obayashi et al. |
| 2008/0155365 A1 | 6/2008 | Casarsa |
| 2008/0250284 A1 | 10/2008 | Guo et al. |
| 2009/0106612 A1 | 4/2009 | Pandey et al. |
| 2010/0017760 A1 | 1/2010 | Kapur et al. |
| 2010/0095173 A1 | 4/2010 | Rahman |
| 2012/0025885 A1 | 2/2012 | Lavery et al. |
| 2012/0246531 A1 | 9/2012 | Jain et al. |
| 2013/0117618 A1 | 5/2013 | Kukreja et al. |
| 2013/0297980 A1 | 11/2013 | Chen et al. |
| 2014/0270050 A1 | 9/2014 | Wang et al. |
| 2014/0298123 A1* | 10/2014 | Tekumalla .......... G06F 11/2215 714/726 |
| 2016/0131706 A1 | 5/2016 | Arsovski et al. |

OTHER PUBLICATIONS

R. Al-Haddad et al., "Sustainable modular adaptive redundancy technique emphasizing partial reconfiguration for reduced power consumption," International Journal of Reconfigurable Computing, vol. 2011, 2011, 430808, 25 pages.

"List of IBM Patents or Patent Applications Treated as Related" 1 page.

"List of IBM Patents or Patent Applications Treated as Related", dated Nov. 14, 2019, 1 page.

Specification "Customer-Transparent Logic Redundancy for Improved Yield" and drawings in related U.S. Appl. No. 16/676,776, filed Nov. 7, 2019, 44 pages.

\* cited by examiner

CUSTOMER-TRANSPARENT LOGIC REDUNDANCY FOR IMPROVED YIELD

FIELD OF THE INVENTION

The invention relates to systems and methods for design for testability in integrated circuits and, more particularly, to systems and methods for implementing customer-transparent logic redundancy in scan chains for improved yield of integrated circuits.

BACKGROUND

Achieving a satisfactory yield of integrated circuit components is becoming increasing difficult in a manufacturing environment in which the number of devices or modules is ever-increasing and the geometries of those devices or modules is ever-decreasing. Conventionally to achieve satisfactory yields, design engineers implement a technique known as design for testability, which incorporates additional hardware designed purely for testing purposes into integrated circuit designs to alleviate the complexity of test pattern generation and increase test coverage. Scan design, a commonly used design for testability technique for testing sequential design, reduces the automatic test pattern generation complexity by providing implicit control and observability of the flip-flop states.

The scan design is achieved by adding a test mode to the integrated circuit design such that when the integrated circuit is in the test mode, all flip-flops are interconnected into chains and act as shift registers. In the test mode, the flip-flops can be set to an arbitrary state by shifting the logic states through the shift register. Similarly, the states can be observed by shifting the contents of the shift registers out. Thus, the inputs and outputs of the flip-flops act like primary inputs and primary outputs of the design and the combinational logic between the flip-flops can be tested with simpler methods used typically for combinational circuits. However, any fault present in the scan design makes fault diagnosis difficult, because the fault can mask out all scan cells in the same scan chain. Consequently, when scan design faults are combined with potential combinational logic faults, the fault diagnosis process can become even more complex and can result in at least a sixty percent integrated circuit chip yield loss for early processes and a similarly significant integrated circuit chip yield loss for mature processes.

SUMMARY

In a first aspect of the invention, an integrated circuit structure is provided for that includes a plurality of combined latch structures. Each of the combined latch structures includes a first input configured to receive data on a first scan path including an original latch and a second input configured to receive data on a second scan path including a redundant latch. The integrated circuit structure further includes a plurality of combined logic structures. Each of the combined logic structures includes a first input configured to receive data on the first scan path including an original logic structure and a second input configured to receive data on the second scan path including a redundant logic structure. Each redundant latch is a duplicate of each respective original latch within a combined latch structure and each redundant logic structure is a duplicate of each respective original logic structure within a combined logic structure such that a two fold library of latches and logic is provided for one or more scan chains of the integrated circuit structure.

In another aspect of the invention, a method is provided for that includes initiating a test scan of a first set of latches of one or more scan chains implemented in a scan design for an integrated circuit chip. The method further includes determining whether all of the one or more scan chains passed the test scan. The method further includes when all of the one or more scan chains do not pass the test scan, identifying a particular scan chain that caused the one or more scan chains to not pass the test scan. The method further includes determining whether there is a repair solution for the identified particular scan chain. The method further includes when there is the repair solution, uploading the repair solution and initiating the test scan on the repair solution. The repair solution is a second set of latches that are duplicates of the first set of latches In yet another aspect of the invention, a computer program product comprising a computer readable storage medium having program instructions embodied therewith, the program instructions executable by at least one processor to cause the at least one processor to initiate a test scan of a first set of latches of one or more scan chains implemented in a scan design for an integrated circuit chip. The at least one processor also being caused to determine whether all of the one or more scan chains passed the test scan. The at least one processor also being caused to when all of the one or more scan chains pass the test scan, initiate a logic test for a first set of logic of the one or more scan chains implemented in the scan design. The at least one processor also being caused to determine whether all logic within the first set of logic passed the logic test. The at least one processor also being caused to when all of the logic within the first set of logic do not pass the logic test, identify a particular scan chain that caused the first set of logic to not pass the logic test. The at least one processor also being caused to determine whether there is a repair solution for the identified particular scan chain. The at least one processor also being caused to when there is the repair solution, upload the repair solution and a corresponding set of latches, and initiate the test scan on the set of latches. The repair solution is as second set of logic that are duplicates of the first set of logic.

BRIEF DESCRIPTION OF THE SEVERAL VIEWS OF THE DRAWINGS

The present invention is described in the detailed description, which follows, in reference to the noted plurality of drawings by way of non-limiting examples of exemplary embodiments of the present invention.

DETAILED DESCRIPTION

The invention relates to systems and methods for design for testing in integrated circuits and, more particularly, to systems and methods for implementing customer-transparent logic redundancy in scan chains for improved yield of integrated circuits. More specifically, implementations of the invention provide for at least two sets of logic and latches that can be implemented within an integrated circuit chip as part of a scan design, and alternately enabled to maneuver around faults within the latches or logic to complete the scan design. Additionally, implementations of the invention provide for systems and methods for testing, enabling, and repairing a scan chain to complete the scan design using the at least two sets of logic and latches. In embodiments, the testing, enabling, and repairing may include (i) testing the latches within a scan chain to identify any faults in the latches, and enabling a valid repair solution (e.g., an alternative set of latches) when there is a fault, and (ii) testing the logic between the latches within a scan chain to identify any faults in the logic, and enabling a valid repair solution (e.g., an alternative set of logic) when there is a fault. Advantageously, the aspects of the present invention provide a structural design test that allows for significant yield increases in integrated circuit chips with sequential elements such as latches or flip-flops.

Sequential elements such as latches or flip-flops create additional complexity to a structural design test because they are able to temporarily store logic states of the integrated circuit. Thus, the logic values of any part of the design depend not only on the current state of the flip-flop, but also on the previous state stored and propagated through the flip-flops over time. Due to the increased complexity of the test pattern generation in sequential designs the test coverage cannot be achieved as high as in purely combinational designs. Consequently, design engineers developed the design for testability technique of scan design.

Figure 1:
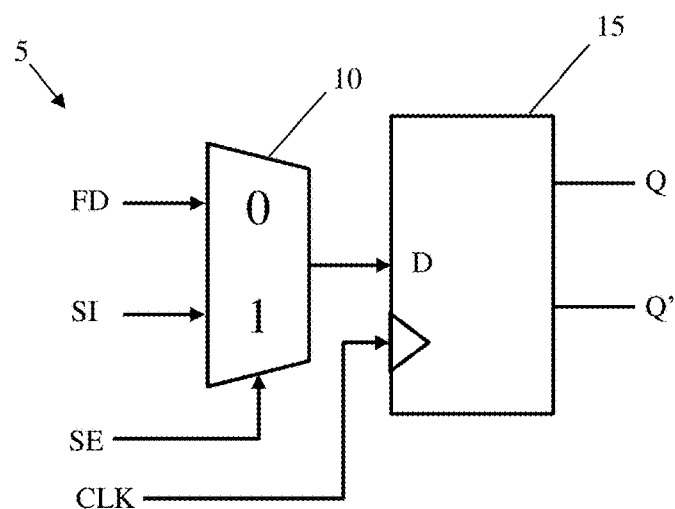
FIG. 1 is a block diagram of a scan cell in accordance with aspects of the invention.

Scan design reduces the complexity of automatic test pattern generation for sequential design by providing direct access to the flip-flops. This is achieved by placing a multiplexer at an input of each flip-flop, either as a separate element or embedded into the design of the latch. An example of a modified scan cell 5 is shown in FIG. 1, comprising a multiplexer 10 and a flip-flop 15. If the scan enable (SE) signal is asserted, the scan cell 5 is in test mode and the test data or scan input (SI) can be loaded into the flip-flop 15. When the SE signal is not asserted, the scan cell 5 operates like a regular flip-flop and the functional data (FD) can be loaded into the flip-flop 15.

All scan cells in an integrated circuit design are interconnected into chains forming shift registers called scan chains. Each of the scan cells has two modes including a functional mode and a scan mode. In the functional mode, each scan cell operates as a normal flip-flop. In the scan mode, which is activated through the scan enable pin of the scan cell, the chain of flip-flops operates like shift registers. Thus, in the scan mode, each scan cell can be set to an arbitrary state by shifting the logic states through the shift register. Similarly, the states can be observed by shifting the contents of the shift registers out. This way the inputs and outputs of the flip-flops act like primary inputs and primary outputs of the design. Consequently, the combinational logic between the flip-flops can be tested with simpler methods used typically for combinational circuits.

Figure 2:
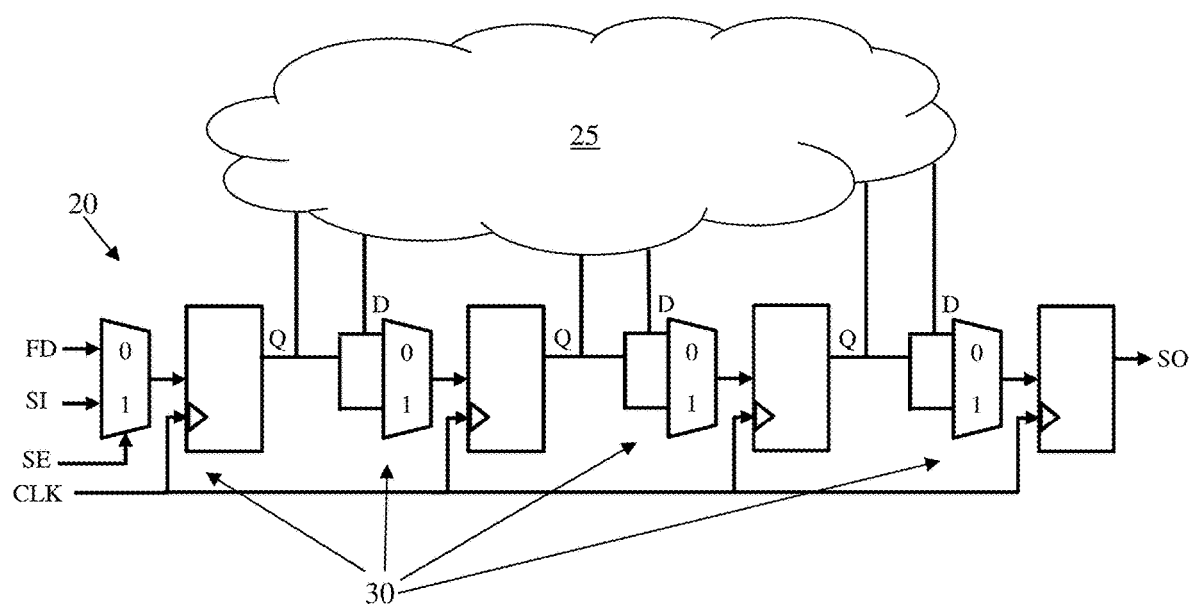
FIGS. 2 and 3 are block diagrams of scan chains in accordance with aspects of the invention.

FIG. 2 shows a scan chain 20 with clock signal (CLK), a scan enable (SE) signal asserted, and a function data (FD) path non-asserted. Scan testing is performed on the scan chain 20 in order to detect any manufacturing fault in the combinatorial logic block 25. In order to perform the scan testing, automatic test equipment (ATE) is configured to excite each and every node within the combinatorial logic block 25 by applying a set of test data or scan inputs (SI), called test vectors or test patterns, to the input pins of the scan cells 30 of the scan chain 20. The test vectors have been predetermined using automatic test pattern generation techniques based on the design specifications of the integrated circuit. The test vectors specify a set of input values for the integrated circuit design as well as corresponding outputs of a defect-free integrated circuit design. The ATE propagates the signal inputs specified by the test vectors though the integrated circuit and observes the values of the output pins of the scan cells 30 of the scan chain 20. The observed outputs values (scan output (SO)) are compared against the specified outputs of a defect-free integrated circuit design, and if at least one of the observed values differs from the specified ones, the chip is declared defective. The probability that the integrated circuit passes all of the test vectors depends on the test coverage.

Figure 3:
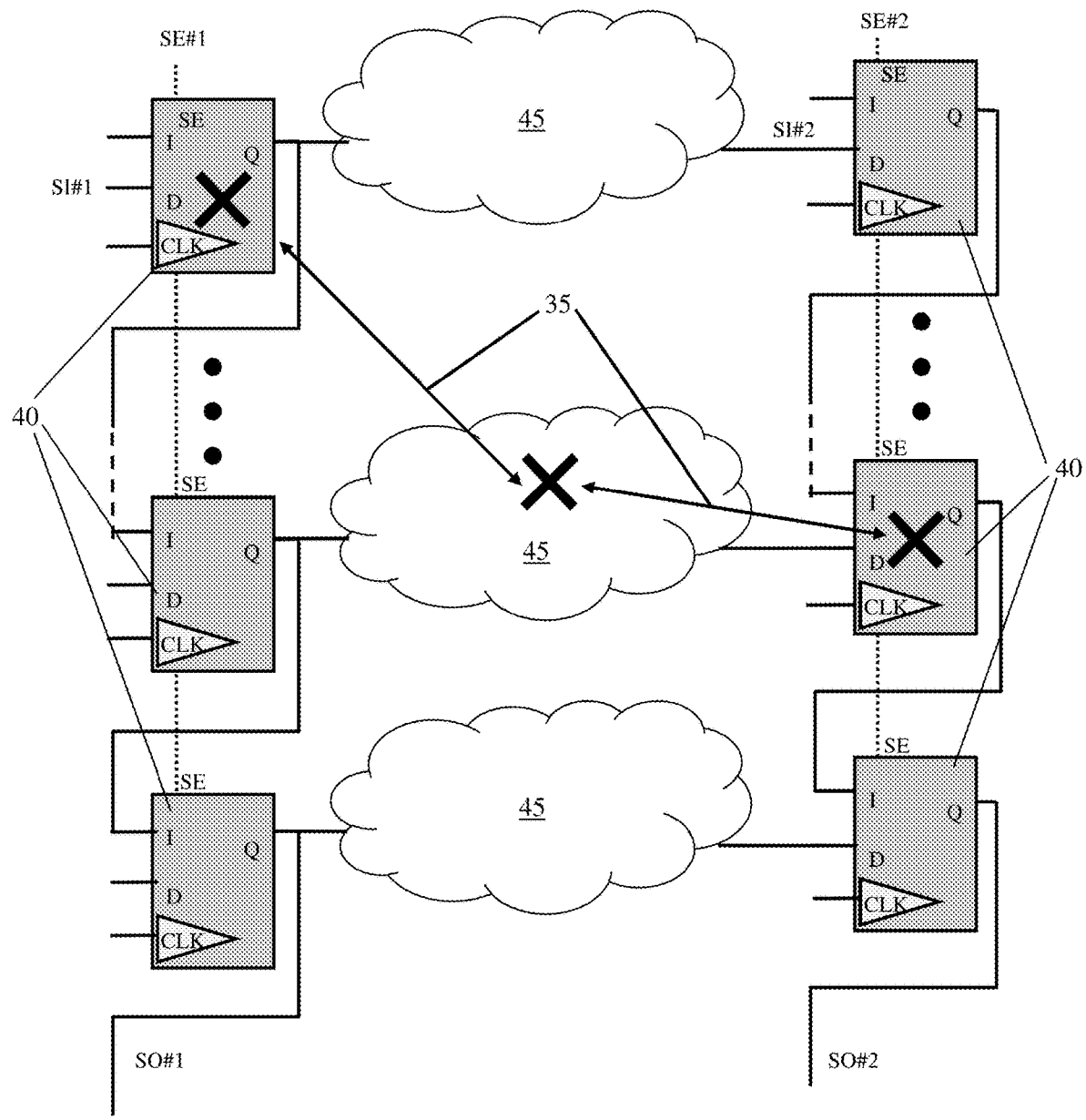

However, it should be understood that when scan design faults are combined with potential combinational logic faults, the fault diagnosis process as described with respect to FIGS. 1 and 2 can become complex and result in about sixty percent of integrated circuit early yield loss and a similarly significant integrated circuit mature yield loss. For example, as shown in FIG. 3, any defect 35 in the latches 40 or the logic 45 between the latches 40 causes an integrated circuit chip to be discarded. Therefore, in a typical instance in which there are, for example, 10,000 latches per scan chain, and there are, for example, 600 hundred scan chains per integrated circuit chip, the probability that the integrated circuit passes all of the test vectors can be very small and it may be difficult to achieve even low yield targets such as 25%.

Accordingly, aspects of the present invention introduce customer transparent logic redundancy through a two fold library comprising redundant latches and logic for one or more scan chains in order to improve yield over that of conventional scan design techniques. More specifically, implementations of the invention provide for two sets of logic and latches that can be alternately enabled to maneuver around faults within the latches or logic and complete a scan design. Although the aspects of the present invention are discussed herein with respect to a two fold library that comprises two sets of latches and logic, it should be understood to those of ordinary skill in the art that the library may actually be further replicated (e.g., tripled or quadrupled) without departing from the spirit and scope of the present invention.

Figure 4:
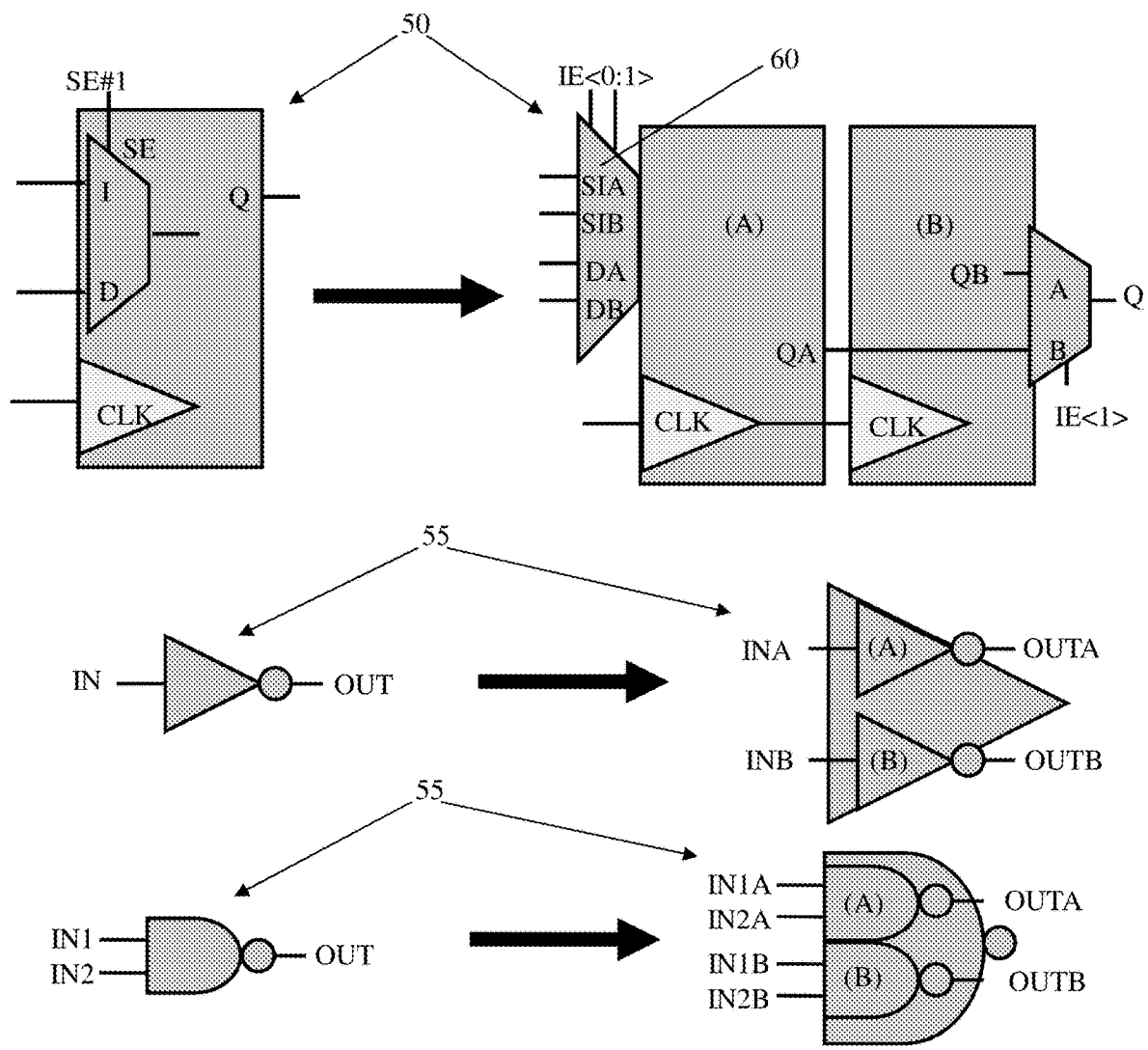
FIG. 4 is a block diagram of redundant latches and logic in accordance with aspects of the invention.

As shown in FIG. 4, the latches 50 and logic 55 (e.g., latches and logic implemented for early technology engagements) of one or more scan chains may be duplicated into at least two sets (A and B) such that one or the other set (A or B) of latches 50 and logic 55 can be alternately enabled to maneuver around faults within the latches 50 or logic 55 to complete the scan. To this end, in embodiments, multiplexer select bits (IE<0:1>) can be input into the multiplexer 60 to perform a scan of the chain of latches 50 and logic 55 using an original scan path (SIA). If the original scan path (SIA)

is determined to be defective due to a defect in one or more of the latches 50 or logic 55, then rather than discard the integrated circuit chip as defective, the multiplexer select bits (IE<0:1>) can be input into the multiplexer 60 to perform a scan of the chain of latches 50 and logic 55 using the redundant scan path (SIB). Consequently, there are decreased instances of scan design faults causing the integrated circuit chips to be discarded.

Figure 5:
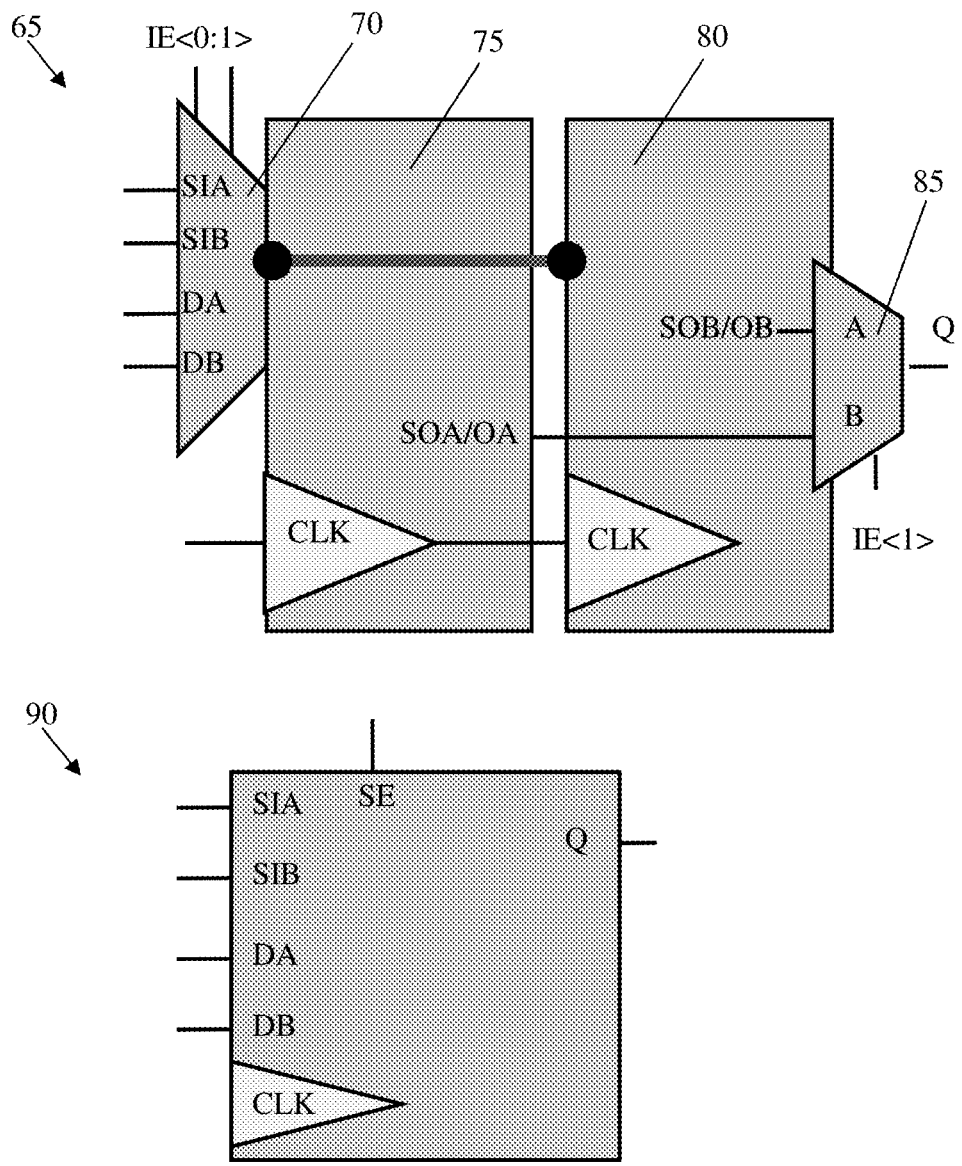
FIG. 5 is a block diagram of a redundant latch in accordance with aspects of the invention.

FIG. 5 shows an example of a redundant latch structure 65 in accordance with aspects of the present invention. In embodiments, the redundant latch structure 65 comprises a multiplexer 70, an original latch structure 75, and a duplicate latch structure 80. The multiplexer 70 is configured to receive multiplexer select bits (IE<0:1>) from, for example ATE, and during a scan design select either original scan path (SIA) or redundant scan path (SIB), or during normal integrated circuit performance select either original data path (DA) or redundant data path (DB). The redundant latch structure 65 is configured to output the data stored within the original latch structure 75 or the redundant latch structure 80 as SOA/OA or SOB/OB, respectively, dependent upon the whether the scan path (SIA)/original data path (DA) or the redundant scan path (SIB)/redundant data path (DB) is selected. The redundant latch structure 65 further comprises a multiplexer 85 configured to forward the output (SOA/OA) or (SOB/OB) as output (Q) to the next logic block or latch within the scan chain for further processing. FIG. 5 also shows that the redundant latch structure 65 can be schematically represented as a redundant latch structure 90 such that the schematic of the two fold library for the integrated circuit chip is transparent to the customer (e.g., both logic paths (original and redundant) will produce the same result).

Figure 6:
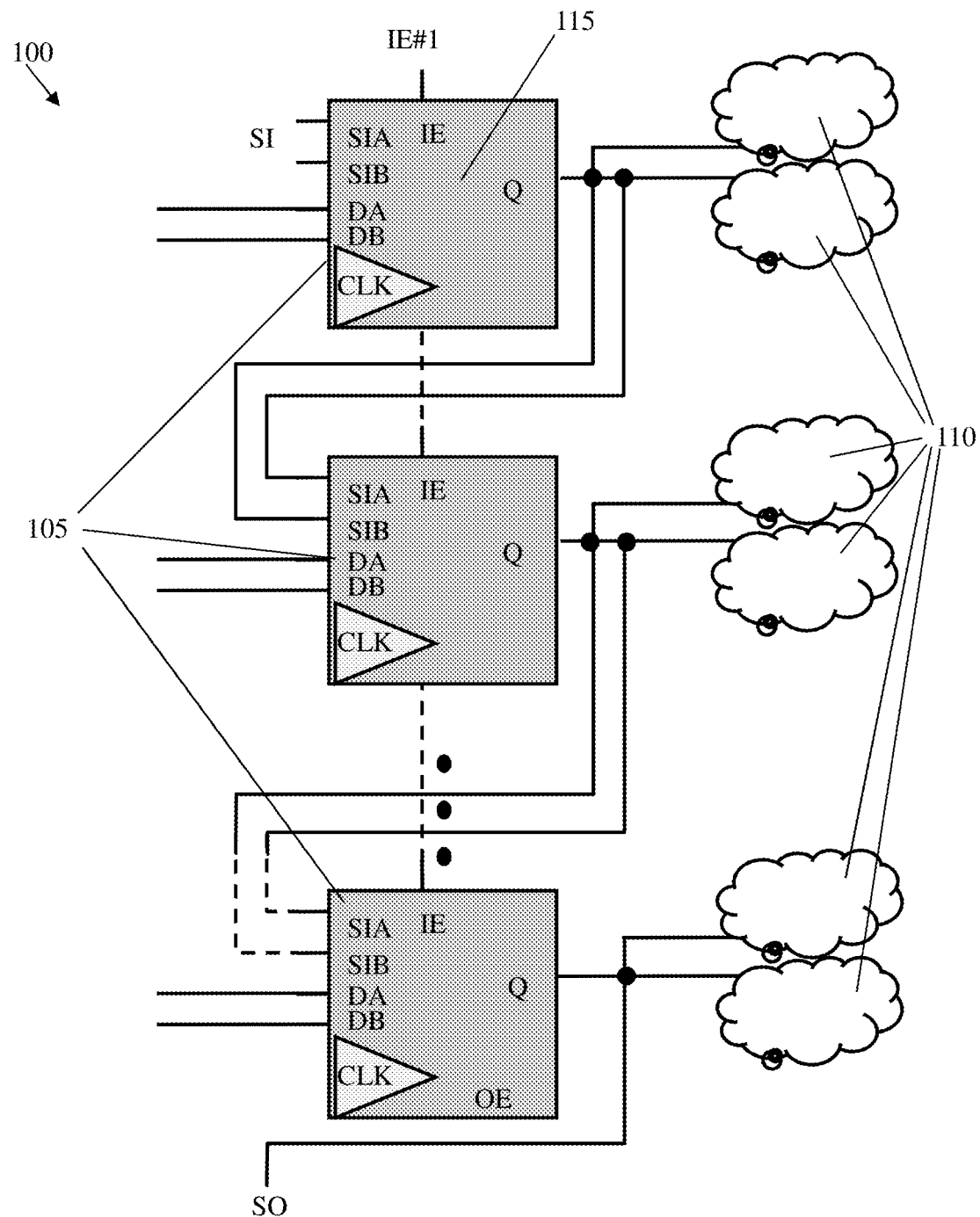
FIGS. 6-9 are block diagrams of scan chains with redundant latches in accordance with aspects of the invention.

FIG. 6 shows an example of a scan chain 100 comprising redundant latches 105 and redundant logic 110 in accordance with aspects of the present invention. In embodiments, the first latch 115 in the scan chain 100 is configured to receive multiplexer select bits (IE<0:1>) from, for example ATE, and during a scan design select either original scan path (SIA) or redundant scan path (SIB), or during normal integrated circuit performance select either original data path (DA) or redundant data path (DB). The redundant latches 105 and redundant logic 110 are configured to process test data (e.g., test vectors (SI)) using either the original scan path (SIA) or the redundant scan path (SIB), and process operational data using either the original data path (DA) or the redundant data path (DB).

In embodiments, if the original scan path (SIA) is functional, for example, the test vectors (SI) are loaded onto the original scan path (SIA) and there are no defects identified with the original latches and logic on the original scan path (SIA) based on the scan output (SO), then the original scan path (SIA) for scan chain 100 is fused as part of a repair solution into non-volatile memory on the integrated circuit chip. Thereafter, when a customer receives the integrated circuit chip and powers the integrated circuit chip on, the repair solution is downloaded from the non-volatile memory and implemented to allow the integrated circuit chip to perform normal operations on data path (DA). However, if the original scan path (SIA) is determined to be defective due to a defect in the original latches or logic based on the scan output (SO), then rather than discard the integrated circuit chip as defective, the test vectors (SI) are loaded onto the redundant scan path (SIB). If the redundant scan path (SIA) is functional, for example, there are no defects identified with the redundant latches and logic on the redundant scan path (SIB) based on the scan output (SO), then the redundant scan path (SIB) for scan chain 100 is fused as part of the repair solution into the non-volatile memory on the integrated circuit chip. Thereafter, when a customer receives the integrated circuit chip and powers the integrated circuit chip on, the repair solution is downloaded from the non-volatile memory and implemented to allow the integrated circuit chip to perform normal operations on data path (DB).

Figure 7:
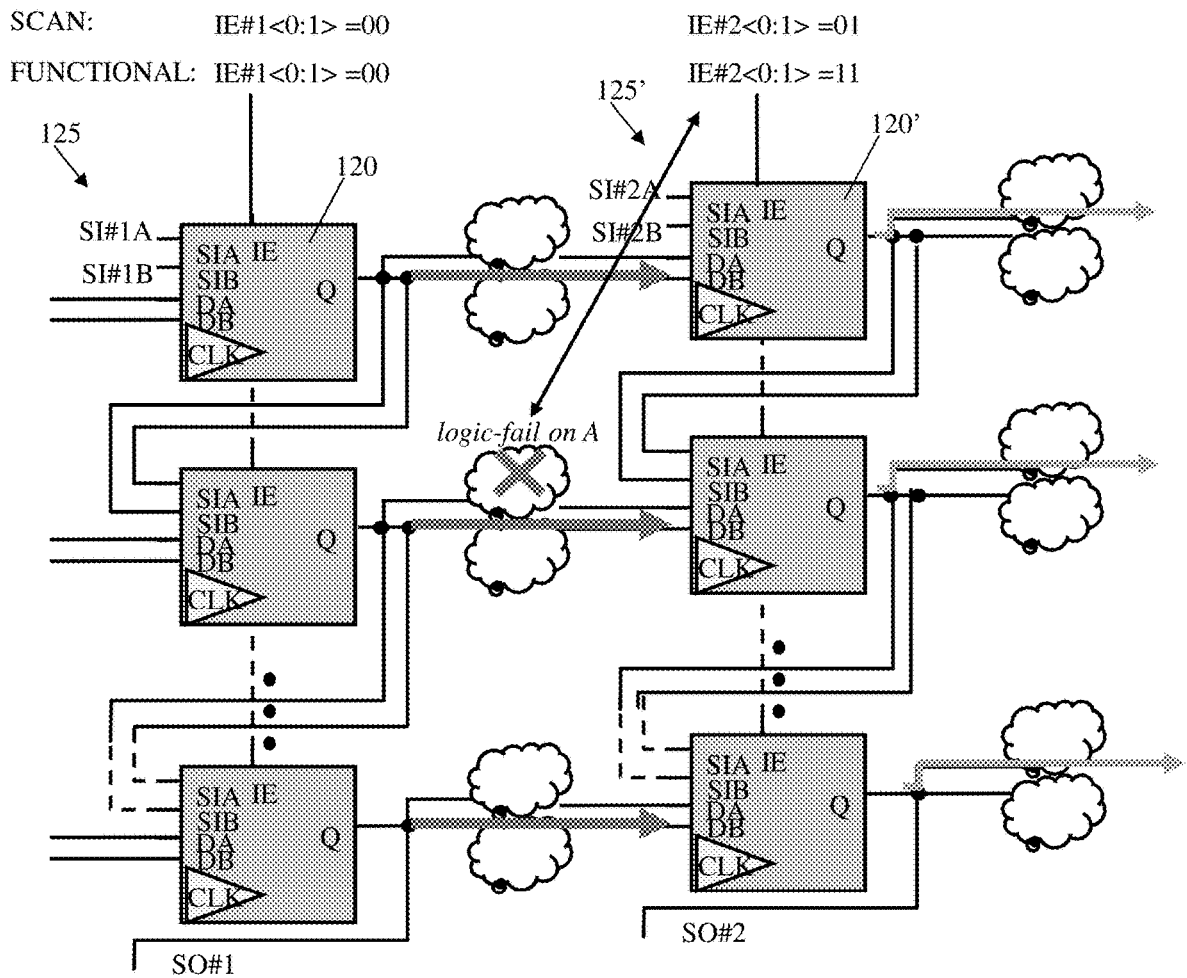

FIG. 7 shows multiplexer select bits (IE<0:1>) being implemented to switch between an original scan path and a redundant scan path when a defect is discovered in the original latches or logic in accordance with aspects of the present invention. For example, the first latch 120 in the original scan chain 125 is configured to receive multiplexer select bits (IE<0:1>) from, for example ATE, and during a scan design select original scan path (SIA). When the original scan path (SIA) is determined to be defective due to a defect 130 in the original latches or logic based on the scan output (SO), then the first latch 120' in the redundant scan chain 125' is configured to receive multiplexer select bits (IE<0:1>) from, for example ATE, and during a scan design select original scan path (SIB).

Figure 8:
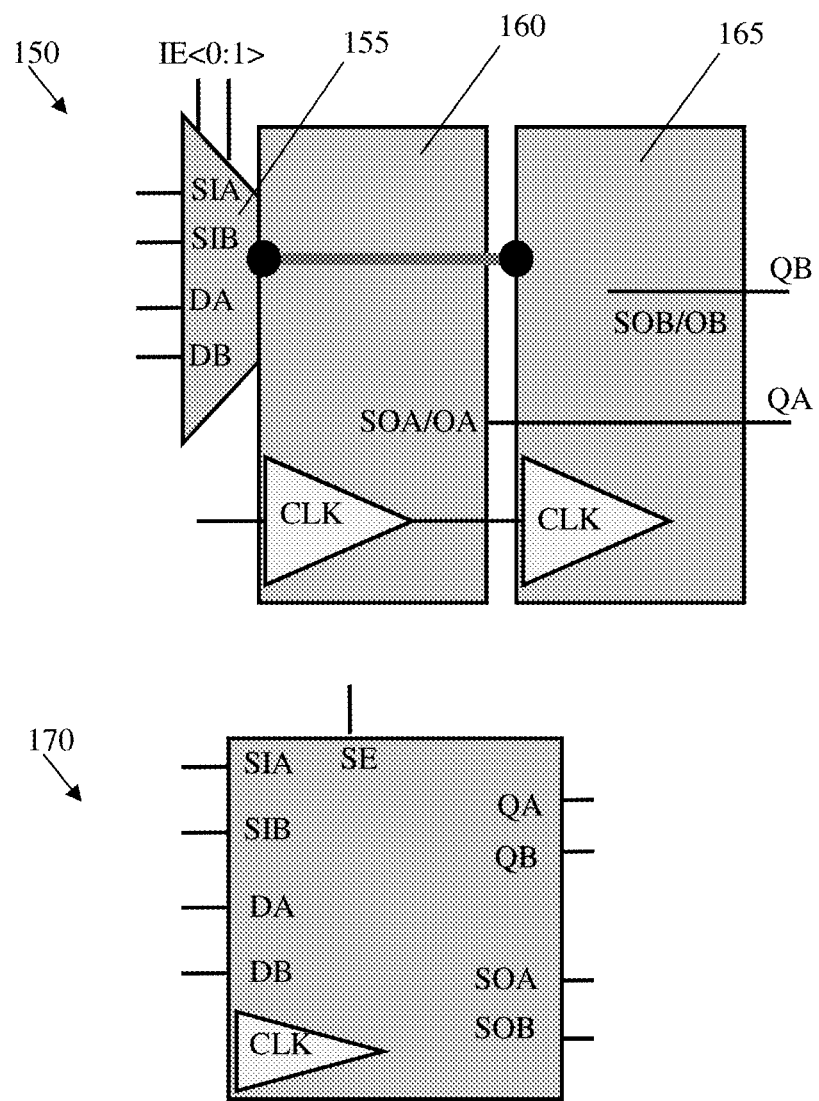

FIG. 8 shows an example of a redundant latch structure 150 in accordance with aspects of the present invention. In alternative or additional embodiments, the redundant latch structure 150 comprises a multiplexer 155, an original latch structure 160, and a duplicate latch structure 165, as similarly described with respect to FIG. 5. The redundant latch structure 150 is configured to output the data stored within the original latch structure 150 or the redundant latch structure 155 as SOA/OA or SOB/OB respectively. However, in contrast to the latch structure 65 shown in FIG. 5, the latch structure 150 is configured to forward the output (SOA/OA) or (SOB/OB) as separate outputs (QA) or (QB), respectively, to the next logic block or latch within the scan chain for further processing. The use of the two separate outputs (QA) and (QB) allow for a scan chain that implements redundant latch structure 150 to effectively disable the inactive path (SIA/DA) or (SIB/DB) since the output Q is no longer being propagated through both paths. Accordingly, the disabling of the inactive path (SIA/DA) or (SIB/DB) results in a power savings for the logic redundancy. FIG. 8 also shows that the redundant latch structure 150 can be schematically represented as a redundant latch structure 170 such that the schematic of the two fold library for the integrated circuit chip is transparent to the customer (e.g., both logic paths (original and redundant) will produce the same result although as two separate outputs).

Figure 9:
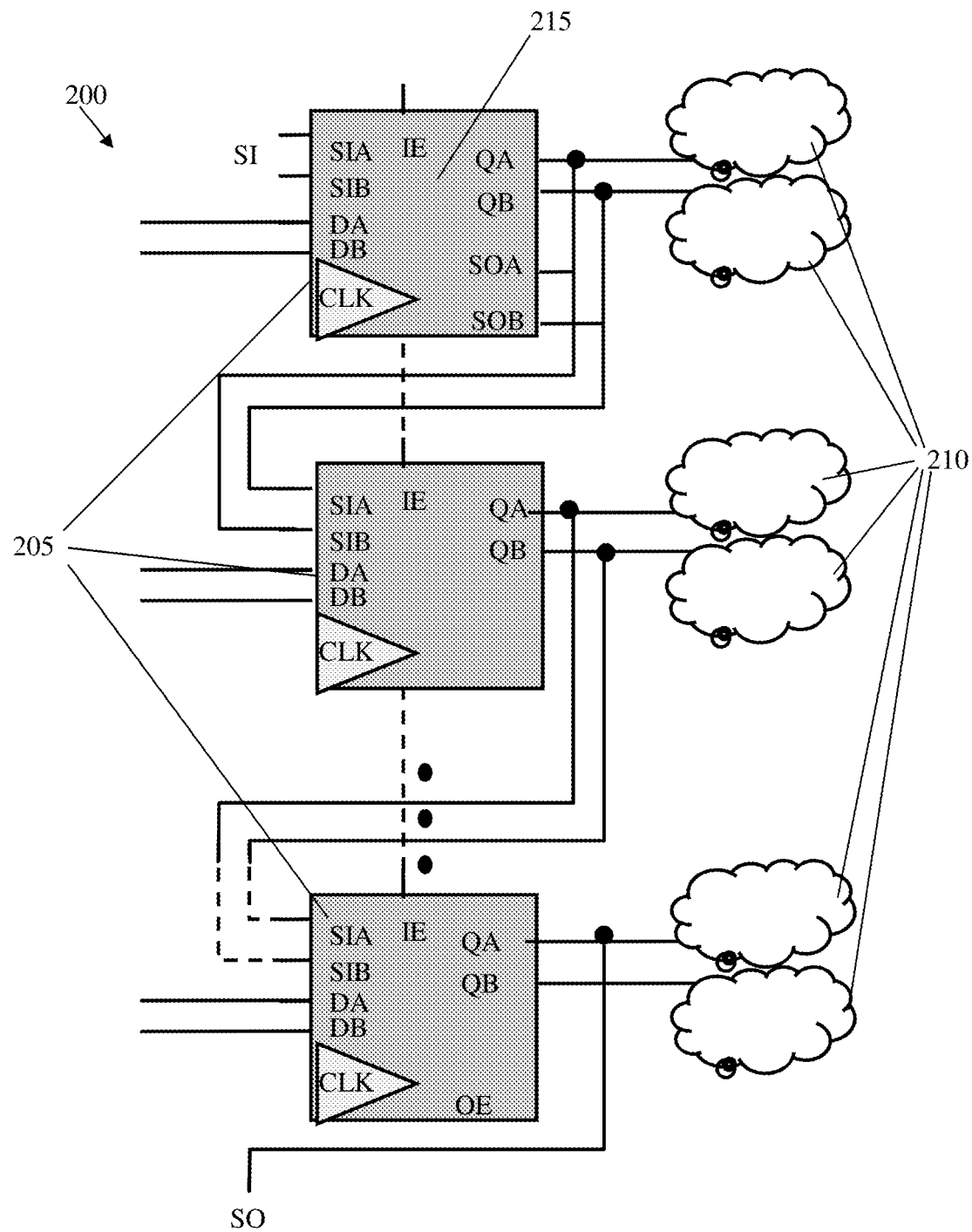

FIG. 9 shows an example of a scan chain 200 comprising redundant latches 205 and redundant logic 210 in accordance with aspects of the present invention. In alternative or additional embodiments, the first latch 215 in the scan chain 200 is configured to receive multiplexer select bits (IE<0:1>) from, for example ATE, and during a scan design select either original scan path (SIA) or redundant scan path (SIB), or during normal integrated circuit performance select either original data path (DA) or redundant data path (DB). The redundant latches 205 and redundant logic 210 are configured to process test data (e.g., test vectors (SI)) using either the original scan path (SIA) or the redundant scan path (SIB), and process operational data using either the original data path (DA) or the redundant data path (DB). The redundant latches 205 are configured to forward the output (SOA/OA) or (SOB/OB) as separate outputs (QA) or (QB), respectively to the next logic block or latch within the scan chain 200 for further processing.

In embodiments, if the original scan path (SIA) is functional, for example, the test vectors (SI) are loaded onto the original scan path (SIA) and there are no defects identified with the original latches and logic on the original scan path (SIA) based on the scan output (SO), then the original scan path (SIA) for scan chain 200 is fused as part of a repair solution into non-volatile memory on the integrated circuit chip. Thereafter, when a customer receives the integrated circuit chip and powers the integrated circuit chip on, the repair solution is downloaded from the non-volatile memory and implemented to allow the integrated circuit chip to perform normal operations on data path (DA). However, if the original scan path (SIA) is determined to be defective due to a defect in the original latches or logic based on the scan output (SO), then rather than discard the integrated circuit chip as defective, the test vectors (SI) are loaded onto the redundant scan path (SIB). If the redundant scan path (SIA) is functional, for example, there are no defects identified with the redundant latches and logic on the redundant scan path (SIB) based on the scan output (SO), then the redundant scan path (SIB) for scan chain 200 is fused as part of the repair solution into the non-volatile memory on the integrated circuit chip. Thereafter, when a customer receives the integrated circuit chip and powers the integrated circuit chip on, the repair solution is downloaded from the non-volatile memory and implemented to allow the integrated circuit chip to perform normal operations on data path (DB).

In embodiments, the repair solution may be fused into the integrated circuit chip using majority voting method. For example, a repair solution (e.g., the redundant scan chain) may be fed into a number (e.g., three or an odd number greater than 1) of redundant latches, and based on the output of the number of latches, a majority vote would be taken to select the correct repair solution. By way of further example, if three latches attempt to store the solution for fusing, and a retrieval of the repair solution includes: Latch #1 output is "1", latch #2 output is a "1" and latch #3 output is defective. Based on this, the solution stored would be a "1", which was the majority vote. The benefit of majority voting is that it is very unlikely that more than one latch would be defective.

Figure 10:
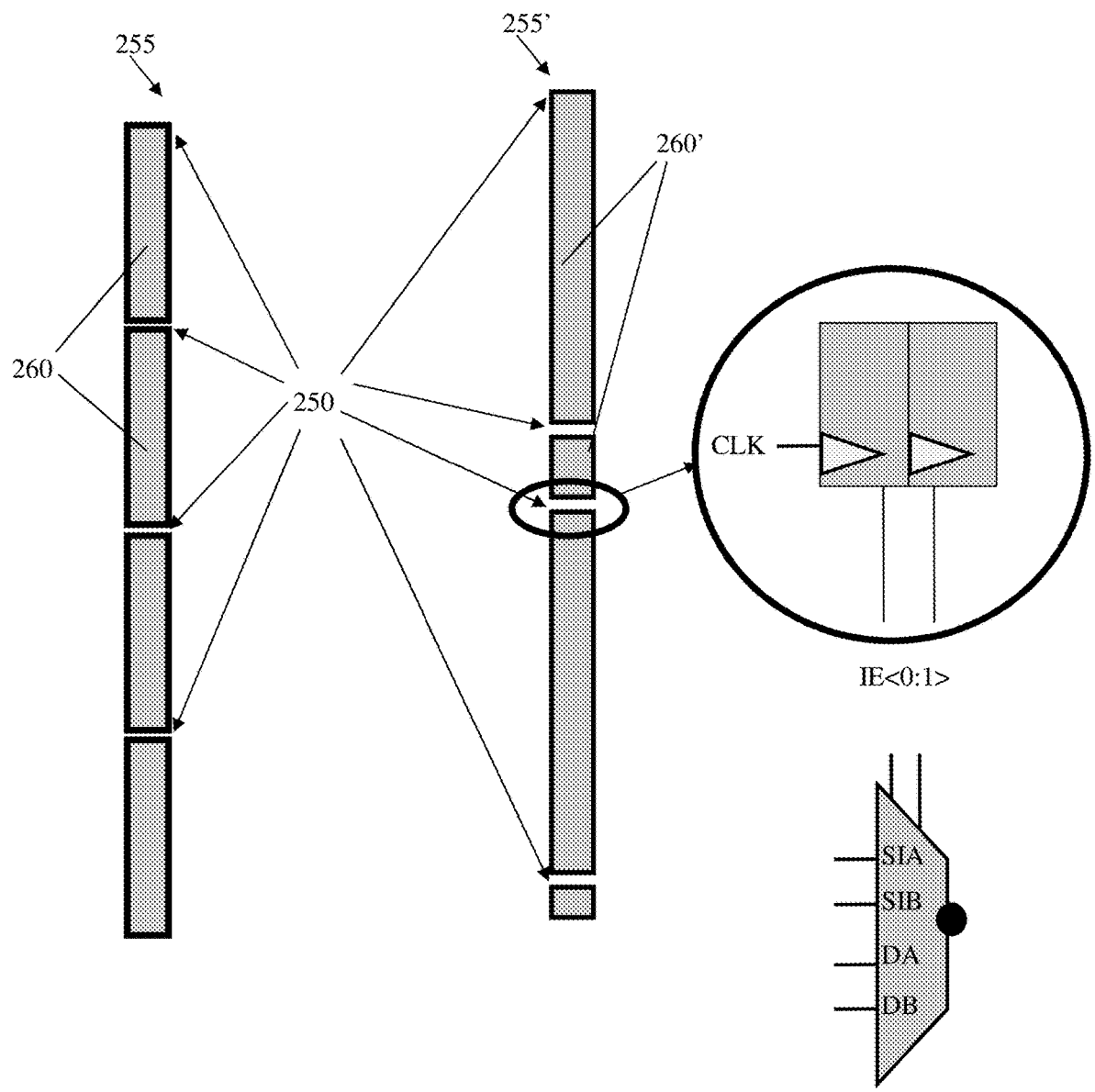
FIG. 10 shows flexibility of design and length of scan chains in accordance with aspects of the invention.

FIG. 10 shows that the placement of the multiplexer select latches 250 (e.g., the latches configured to receive multiplexer select bits (IE<0:1>)) within a scan design 255, 255' to partition the various scan chains 260, 260' may be at the discretion of the designer of the scan design 255, 255'. For example, each time the multiplexer select bits (IE<0:1>) are changed, a different path is selected within the scan design and likewise a different part of the repair solution is fused into the non-volatile memory on the integrated circuit chip. Accordingly, the multiplexer select latches 250 can be placed within the scan design 255, 255' to function as boundaries to define different scan chains (e.g., implemented every 4,000 latches). To this end, in embodiments, the multiplexer select latches 250 may be placed within the scan design 255, 255' in a pre-set consistent manner (e.g., the multiplexer select latches may be implemented every 10,000 latches in a design with over six million latches in total, or in a design with only 12,000 latches in total, it may make more sense to implement a multiplexer select latch every four thousand latches).

In alternative embodiments, the multiplexer select latches 250 may be placed within the scan design 255, 255' to function as boundaries between different logic components of the integrated circuit chip. For example, the column redundancy latches in a dynamic random access memory (DRAM) may be configured using the multiplexer select latches 250 to operate on a separate latch path from the row redundancy latches, rather than have both on the same latch path. Advantageously, the placement of the multiplexer select latches within a scan design gives flexibility in the design and length of the scan chains and could be analyzed and implemented in a case by case basis.

Although the two fold library described herein may cause a small increase in chip area and power consumed, the aspects of the present invention have been proven to achieve significant increases in yield, which offset the small increase in chip area and power consumed. For example, assuming a no partial good (e.g., the customer has not already requested logic redundancy for any components such as processors or memory) is implemented in a typical 32 nm integrated circuit chip, then the area of the integrated circuit chip that is consumed by circuits may increase by about thirty-two percent. Furthermore, assuming a partial good (e.g., the customer has already requested logic redundancy for components such as processors or memory, and the redundancy implemented by aspects of the present invention is mainly for the logic connected to the components such as processors or memory) is implemented in a typical 32 nm integrated circuit chip, then the area of the integrated circuit chip that is consumed by circuits may increase by about sixteen percent.

Figure 11:
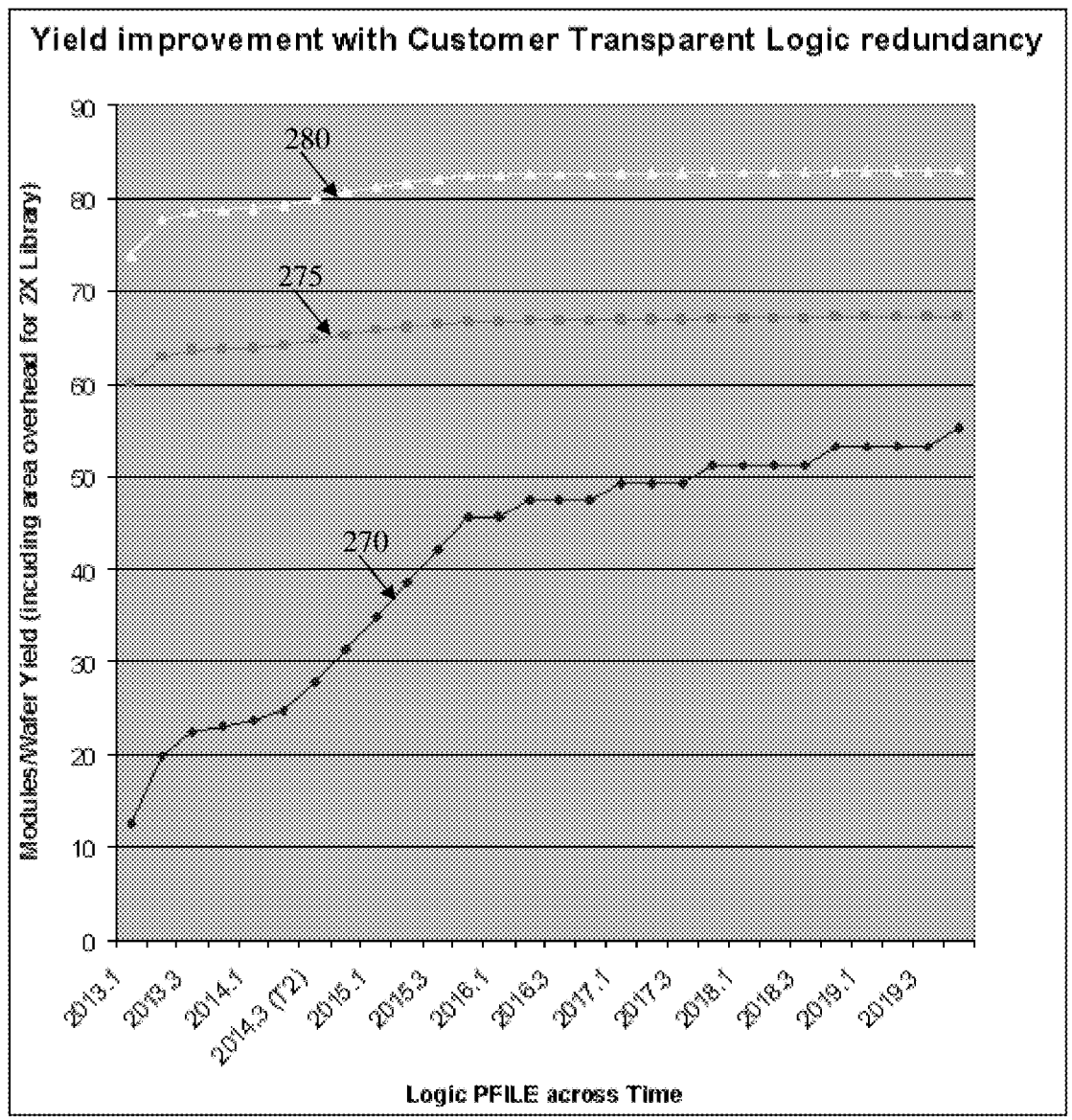
FIG. 11 shows yield improvement with customer transparent logic redundancy in accordance with aspects of the invention.

However, as shown in FIG. 11, the small increase in chip area and power consumed is more than adequately offset by the yield improvement. Specifically, FIG. 11 shows that in instances where no redundancy is used (data line 270), there is only about an eleven to twenty percent integrated circuit chip yield for early processes (e.g., 2013) and about fifty to sixty percent integrated circuit chip yield for mature processes (e.g., 2019). In contrast, in instances where there is only latch and logic redundancy implemented in accordance with aspects of the present invention (e.g., no partial good is implemented by the customer) (data line 275), there is about sixty to sixty five percent integrated circuit chip yield for early processes (e.g., 2013) and about sixty-five to seventy percent integrated circuit chip yield for mature processes (e.g., 2019). Moreover, in instances where there is partial good implemented by the customer and latch and logic redundancy implemented in accordance with aspects of the present invention (data line 280), there is about seventy-two to eighty percent integrated circuit chip yield for early processes (e.g., 2013) and about eighty to eighty-five percent integrated circuit chip yield for mature processes (e.g., 2019).

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 12:
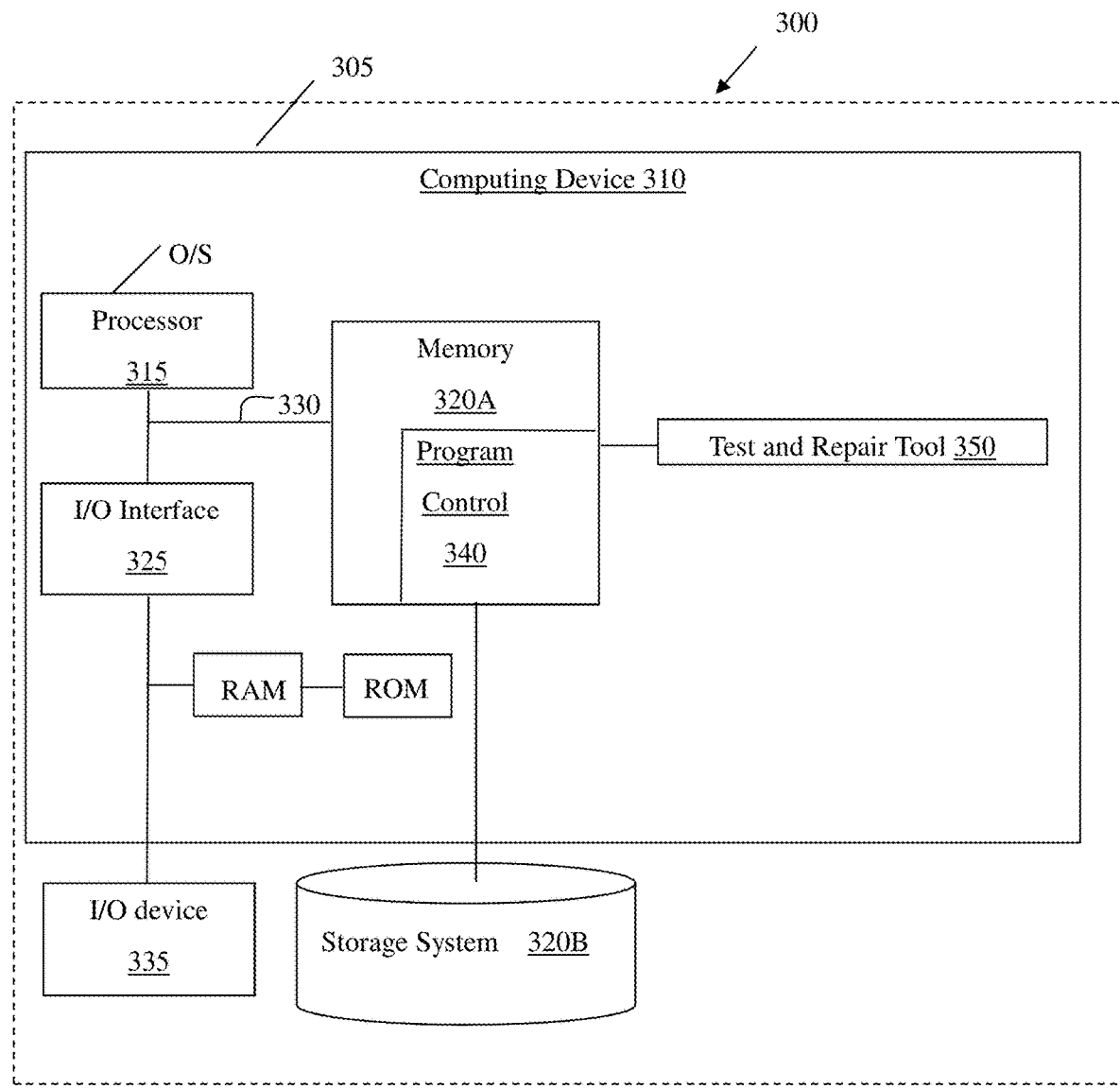
FIG. 12 is an illustrative external environment for implementing the invention in accordance with aspects of the invention.

With reference now to FIG. 12, an illustrative environment 300 is provided for managing the processes in accordance with the present invention. To this extent, the environment 300 includes a server or other computing system 305 that can perform the processes described herein. In particular, the server 305 includes a computing device 310 (e.g., ATE). The computing device 310 can be resident on a network infrastructure or computing device of a third party service provider (any of which is generally represented in FIG. 1).

The computing device 310 also includes a processor 315 (e.g., CPU), memory 320A, an I/O interface 325, and a bus 330. The memory 320A can include local memory employed during actual execution of program code, bulk storage, and cache memories which provide temporary storage of at least some program code in order to reduce the number of times code must be retrieved from bulk storage during execution. In addition, the computing device includes random access memory (RAM), a read-only memory (ROM), and an operating system (O/S).

The computing device 310 is in communication with the external I/O device/resource 335 and the storage system 320B. For example, the I/O device 335 can comprise any device that enables an individual to interact with the computing device 310 (e.g., user interface) or any device that enables the computing device 310 to communicate with one or more other computing devices using any type of communications link. The external I/O device/resource 335 may be for example, a handheld device, PDA, handset, keyboard etc.

In general, the processor 315 executes computer program code (e.g., program control 340), which can be stored in the memory 320A and/or storage system 320B. Moreover, in accordance with aspects of the invention, the program control 340 controls a test and repair tool 350, e.g., at least a portion of an ATE application or tool, which performs the processes described herein. The test and repair tool tool 350 can be implemented as one or more program code in the program control 345 stored in memory 320A as separate or combined modules. Additionally, the test and repair tool 350 may be implemented as separate dedicated processors or a single or several processors to provide the function of these tools.

In embodiments, the test and repair tool 350 may be configured to test, enable, and repair a scan chain to complete a scan design using at least two sets of logic and latches (e.g., a two fold library comprising an original set of latches and logic and a redundant set of latches and logic). In embodiments, the testing, enabling, and repairing may include amongst other things described herein (i) testing the latches within a scan chain to identify any faults in the latches, and enabling a valid repair solution (e.g., an alternative set of latches) when there is a fault, and (ii) testing the logic between the latches within a scan chain to identify any faults in the logic, and enabling a valid repair solution (e.g., an alternative set of logic) when there is a fault.

While executing the computer program code, the processor 315 can read and/or write data to/from memory 320A, storage system 320B, and/or I/O interface 325. The program code executes the processes of the invention. The bus 330 provides a communications link between each of the components in the computing device 310.

The computing device 310 can comprise any general purpose computing article of manufacture capable of executing computer program code installed thereon (e.g., a personal computer, server, etc.). However, it is understood that the computing device 310 is only representative of various possible equivalent-computing devices that may perform the processes described herein. To this extent, in embodiments, the functionality provided by the computing device 310 can be implemented by a computing article of manufacture that includes any combination of general and/or specific purpose hardware and/or computer program code. In each embodiment, the program code and hardware can be created using standard programming and engineering techniques, respectively.

Similarly, server 305 is only illustrative of various types of computer infrastructures for implementing the invention. For example, in embodiments, server 305 comprises two or more computing devices (e.g., a server cluster) that communicate over any type of communications link, such as a network, a shared memory, or the like, to perform the process described herein. Further, while performing the processes described herein, one or more computing devices on server 305 can communicate with one or more other computing devices external to server 305 using any type of communications link. The communications link can comprise any combination of wired and/or wireless links; any combination of one or more types of networks (e.g., the Internet, a wide area network, a local area network, a virtual private network, etc.); and/or utilize any combination of transmission techniques and protocols.

Figure 13:
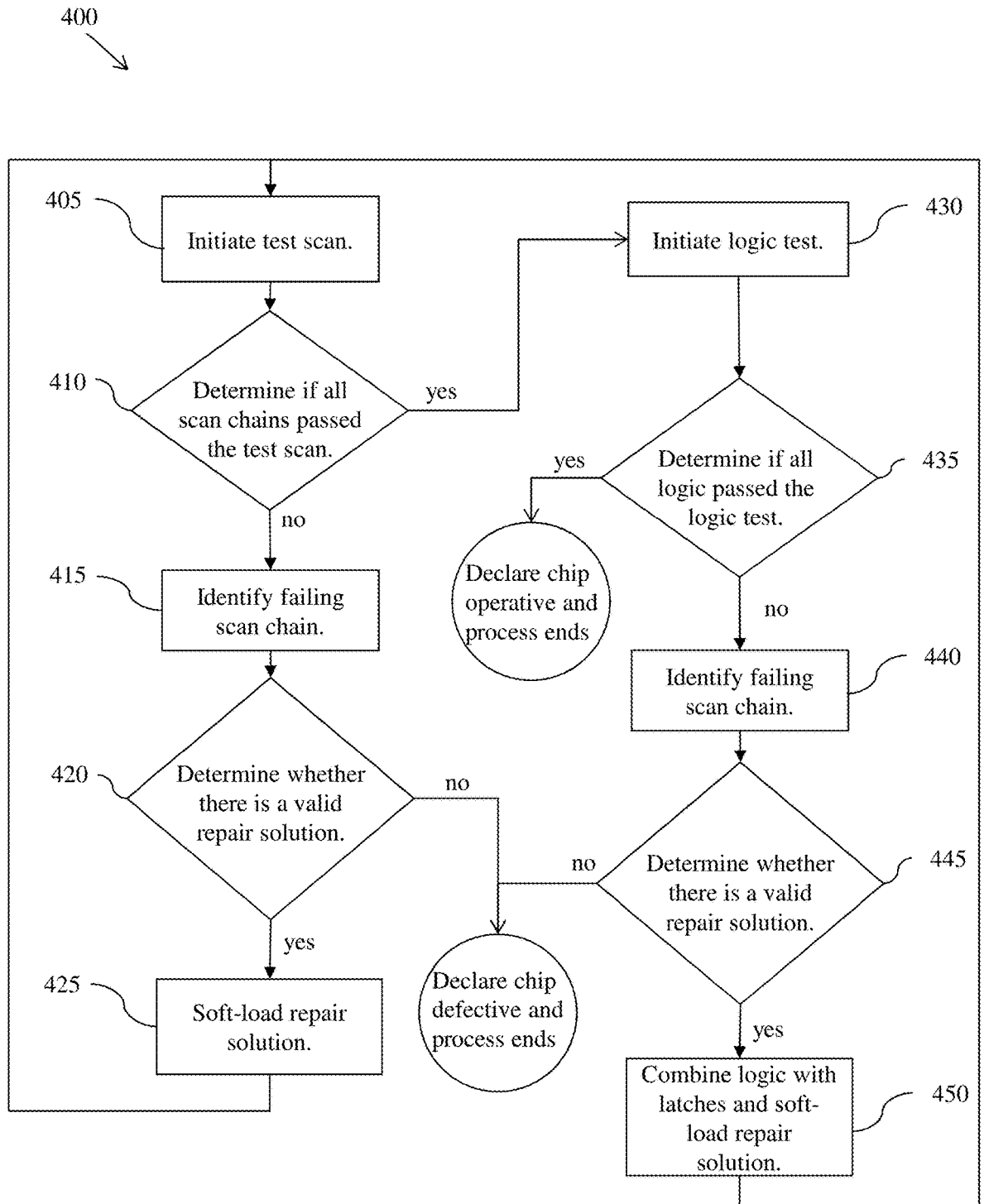
FIG. 13 is an illustrative process flow for implementing the processes in accordance with aspects of the invention.

FIG. 13 shows an exemplary flow for performing aspects of the present invention. The steps of FIG. 13 may be implemented in the environment of FIG. 12, for example. As noted above, the flowchart(s) illustrate the architecture, functionality, and operation of possible implementations of systems, methods, and computer program products according to various embodiments of the present invention. In embodiments, a process 400 is provided for testing, enabling, and repairing a scan chain to complete a scan design using at least two sets of logic and latches (e.g., a two fold library comprising an original set of latches and logic and a redundant set of latches and logic).

At step 405, a test scan is initiated for a first set of latches of one or more scan chains implemented in a scan design. For example, an ATE (e.g., computing device 310 described with respect to FIG. 12) may be configured to (i) send a scan enable signal to a first latch (e.g., a multiplexer select latch) of each of the one or more scan chains to enable a test mode for each of the one or more scan chains, and (ii) send a multiplexer select bit (IE<0:1>) to the first latch of each of the one or more scan chains to load a test vector into the first set of latches. In embodiments, the multiplexer select bit (IE<0:1>) effectively causes the test vector to be input into the first set of latches and propagated through a first scan path (e.g., an original scan path) within the one or more scan chains.

At step 410, a determination is made as to whether all of the one or more scan chains passed the test scan. For example, an ATE (e.g., computing device 310 described with respect to FIG. 12) may be configured to observe the outputs from the latches within the first set of latches of the one or more scan chains, and compare the observed outputs against specified outputs of a defect-free scan design. If at least one of the observed outputs differs from the specified outputs, the first set of latches is declared defective (a fault is identified) and the process proceeds to step 415. If none of the observed outputs differs from the specified outputs, the first set of latches is declared operative (a fault is not identified) and the process proceeds to step 430.

At step 415, a particular scan chain that caused the fault is identified. For example, the scan design is analyzed by the ATE (e.g., computing device 310 described with respect to FIG. 12) to identify the latch that provided the at least one observed output that differed from a specified output. The identified latch is then mapped back to the particular scan chain that caused the fault.

At step 420, a determination is made as to whether a valid repair solution exits for the particular scan chain that caused the fault. For example, the ATE (e.g., computing device 310 described with respect to FIG. 12) may be configured to determine whether the first set of latches for a first scan path are an original scan path. When the first set of latches for a first scan path are an original scan path, then a valid repair solution of a second set of latches for a second scan path are identified as a valid repair solution and the process proceeds to step 425. When the first set of latches for a first scan path are not an original scan path, then a valid repair solution is not identified, the integrated circuit chip is declared defective and/or discarded, and the process ends.

At step 425, the second set of latches for the second scan path is soft-loaded. For example, the ATE (e.g., computing device 310 described with respect to FIG. 12) may be configured to change the multiplexing select bits from the original scan path to a redundant scan path (e.g., switching IE<0:1>=00 to 01). In embodiments, soft-loading can be programmed into the ATE. Accordingly, each time a fail is encountered, the multiplexing select bits may be incremented by 1. The process then proceeds back to step 405 to initiate a test scan for the second set of latches of the one or more scan chains based on the new multiplexing select bits. If another fail is encountered, again the multiplexing select bits may be incremented by 1 (now count=2) for another set of latches of the one or more scan chains.

At step 430, a logic test is initiated for a first set of logic of one or more scan chains implemented in a scan design. For example, an ATE (e.g., computing device 310 described with respect to FIG. 12) may be configured to (i) send a scan enable signal to a first latch (e.g., a multiplexer select latch) of each of the one or more scan chains to enable a test mode for each of the one or more scan chains, and (ii) send a multiplexer select bit (IE<0:1>) to the first latch of each of the one or more scan chains to load a test vector into the first set of latches. In embodiments, the multiplexer select bit (IE<0:1>) effectively causes the test vector to be input into the first set of latches and propagated through a first scan path (e.g., an original scan path) that includes the first set of logic.

At step 435, a determination is made as to whether all logic within the first set of logic passed the logic test. For example, an ATE (e.g., computing device 310 described with respect to FIG. 12) may be configured observe outputs from all of the logic within the first set of logic of the one or more scan chains, and compare the observed outputs against specified outputs of a defect-free scan design. If at least one of the observed outputs differs from the specified outputs, the first set of logic is declared defective (a fault is identified) and the process proceeds to step 440. If none of the observed outputs differs from the specified outputs, the integrated circuit chip is declared operative (a fault is not identified) and the process ends.

At step 440, a particular scan chain that caused the fault is identified. For example, the scan design is analyzed by the ATE (e.g., computing device 310 described with respect to FIG. 12) to identify the logic that provided the at least one observed output that differed from a specified output. The identified logic is then mapped back to the particular scan chain that caused the fault.

At step 445, a determination is made as to whether a valid repair solution exits for the particular scan chain that caused the fault. For example, the ATE (e.g., computing device 310 described with respect to FIG. 12) may be configured to determine whether the first set of logic for a first scan path are an original scan path. When the first set of logic for a first scan path are an original scan path, then a valid repair solution of a second set of logic for a second scan path are identified as a valid repair solution and the process proceeds to step 450. When the first set of logic for a first scan path are not an original scan path, then a valid repair solution is not identified, the integrated circuit chip is declared as defective and/or discarded, and the process ends.

At step 450, the second set of logic for a second scan path is soft-loaded and combined with a second set of latches. For example, the ATE (e.g., computing device 310 described with respect to FIG. 12) may be configured to change the multiplexing select bits from the original scan path to a redundant scan path (e.g., switching IE<0:1>=00 to 01). In embodiments, soft-loading can be programmed into the ATE. Accordingly, each time a fail is encountered, the multiplexing select bits may be incremented by 1. The process then proceeds back to step 405 to initiate a test scan for the second set of latches and logic of the one or more scan chains based on the new multiplexing select bits. If another fail is encountered, again the multiplexing select bits may be incremented by 1 (now count=2) for another set of latches or logic of the one or more scan chains.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
    initiating a test scan of a plurality of latch structures including original latch structures and a plurality of repair latch structures which are respectively duplicates of each respective original latch within the plurality of latch structures;
    providing an output indicative of whether all of the original latch structures are not defective in response to the test scan of the plurality of latch structures;
    when all of the original latch structures of the plurality of latch structures pass the test scan, initiating a logic test, different than the test scan, of a plurality of logic structures, including original logic structures and a plurality of repair logic structures which are respectively duplicates of each respective original logic structure within the plurality of logic structures, such that a two-fold library of latches and logic is provided for one or more scan chains of an integrated circuit structure comprised of the plurality of latch structures and the plurality of logic structures; and
    when one of the original latch structures does not pass the test scan, substituting one of the repair latch structures for a defective original latch structure as a repair and initiating the logic test on the plurality of logic structures after the repair latch structure has been substituted.

2. The method of claim 1, further comprising, when one of the original logic structures does not pass the logic test, substituting one of the repair logic structures for the one of the original logic structure as a repair.

3. The method of claim 2, further comprising preventing the logic test from being carried out unless at least all of the original latch structures pass the test scan or any of the original latch structures determined to be defective is repaired by one of the repair latch structures.

4. The method of claim 3, wherein:
    at least one of the plurality of latch structures further includes an input multiplexer configured to receive a plurality of multiplexer select bits.

5. The method of claim 4, wherein a first select bit of the plurality of multiplexer select bits enables a test vector to be loaded into a first input of the plurality of latch structures.

6. The method of claim 5, wherein a second select bit of the plurality of multiplexer select bits enables the test vector to be loaded into a second input of the plurality of latch structures.

7. The method of claim 6, wherein the plurality of latch structures further comprise an output multiplexer.

8. The method of claim 7, further comprising receiving data from one of the original latch structures on a first scan path or data from one of the repair latch structures on a second scan path, and forwarding the data from the one of the original latch structures or the one of the repair latch structures based on the plurality of multiplexer select bits.

9. The method of claim 8, further comprising receiving the data from the output multiplexer of the plurality of latch structures at the plurality of logic structures.

10. The method of claim 9, wherein the plurality of latch structures further comprise a first output configured to output data from one of the original latch structures on the first scan path, and a second output configured to output data from one of the repair latch structures on the second scan path.

11. The method of claim 10, further comprising receiving the data output from one of the original latch structures on the first scan path at a first input of the plurality of logic structures, and receiving the data output from one of the repair latch structures on the second scan path at a second input of the plurality of logic structures.

12. The method of claim 1, further comprising, when one of the original latch structures does not pass the test scan, determining whether there is a valid repair solution by determining whether a non-defective repair latch structure is available to substitute for the defective original latch structure as a repair.

13. The method of claim 12, w herein the integrated circuit structure comprises an integrated circuit chip, and wherein, when it is determined that a non-defective repair latch structure is not available to substitute for the defective original latch structure as a repair, declaring the integrated circuit chip as defective.

14. The method of claim 1, further comprising:
in response to all of the logic structures within the plurality of logic structures not passing the logic test, identifying a particular scan chain in the plurality of latch structures that caused the plurality of logic structures to not pass the logic test; and
determining whether a repair solution exists for the identified particular scan chain.

15. The method of claim 1, further comprising determining whether one or more scan chains of the plurality of latch structures passed the test scan, wherein the determining whether the one or more scan chains of the plurality of latch structures passed the test scan comprises:
observing the outputs from the plurality of latches; and
comparing the observed outputs against specified outputs of a defect-free scan design.

16. The method of claim 15, further comprising:
determining when at least one of the observed outputs differs from a specified output;
identifying a particular scan chain in the plurality of latch structures that caused the latch structures in one or more scan chains of the plurality of latch structures to not pass the test scan; and
in response to none of the observed outputs differing from the specified output, initiating the logic test for a first set of logic of the one or more scan chains implemented in the scan design.

* * * * *